United States Patent [19]

Nagoya et al.

[11] Patent Number: 5,854,971
[45] Date of Patent: Dec. 29, 1998

[54] OUTPUT-CONTROLLED POWER AMPLIFIER, RADIO COMMUNICATION TERMINAL AND RADIO COMMUNICATION BASE STATION

[75] Inventors: Yoshinori Nagoya, Yokohama; Takashi Sakai, Fujisawa; Yuji Ishida, Machida; Ken Takei, Hachioji, all of Japan

[73] Assignee: Hitachi, Ltd., Tokyo, Japan

[21] Appl. No.: 622,135

[22] Filed: Mar. 27, 1996

[30] Foreign Application Priority Data

Mar. 31, 1995 [JP] Japan .................................. 7-075487

[51] Int. Cl.⁶ .................................................. H01Q 11/12
[52] U.S. Cl. .......................... 455/126; 330/129; 330/284
[58] Field of Search .................................... 455/126, 127, 455/116; 330/129, 284, 289, 140, 280; 375/297

[56] References Cited

U.S. PATENT DOCUMENTS

| | | | |
|---|---|---|---|
| 4,523,155 | 6/1985 | Walczak et al. | 330/289 X |
| 4,803,440 | 2/1989 | Hotta et al. | 330/284 X |
| 5,196,806 | 3/1993 | Ichihara | 455/126 X |
| 5,212,814 | 5/1993 | Iwane | 455/126 X |
| 5,303,268 | 4/1994 | Tsutsumi et al. | 455/116 X |
| 5,369,789 | 11/1994 | Kosugi et al. | 455/126 |
| 5,381,115 | 1/1995 | Timmons et al. | 330/129 X |
| 5,383,223 | 1/1995 | Inokuchi | 455/126 X |
| 5,507,016 | 4/1996 | Okuhara | 330/284 X |

FOREIGN PATENT DOCUMENTS

| | | |
|---|---|---|
| 0414352 | 2/1991 | European Pat. Off. . |
| 0468507 | 1/1992 | European Pat. Off. . |
| 0535669 | 4/1993 | European Pat. Off. . |
| 200710 | 8/1989 | Japan . |
| 154430 | 7/1991 | Japan . |
| 102767 | 4/1993 | Japan . |
| 95295 | 4/1993 | Japan . |
| 129861 | 5/1993 | Japan . |
| 129880 | 5/1993 | Japan . |
| 191301 | 7/1993 | Japan . |
| 344088 | 12/1993 | Japan . |
| 14320 | 1/1994 | Japan . |
| 284022 | 10/1994 | Japan . |
| 2245785 | 1/1992 | United Kingdom . |

OTHER PUBLICATIONS

*Personal Handy Phone System Private Standard/Public Standard of Japan*, RCR STD-28, English Version, pp. 1–43, date unknown.

Horowitz et al., *The Art of Electronics*, First Edition, pp. 246–247, date and publisher unknown.

*Primary Examiner*—Thomas J. Mullen, Jr.
*Attorney, Agent, or Firm*—Antonelli, Terry, Stout & Kraus, LLP

[57] ABSTRACT

In an output-controlled power amplifier of a closed loop type, an input signal is inputted to a main path in which the input signal is power-attenuated by a variable attenuator and power-amplified by a power amplifier. A power divider distributes the amplified input signal between the main path and a feedback path diverging from the main path so that the signal distributed to the main path is outputted from the main path to the exterior while the input signal is controlled on the basis of the signal distributed to the feedback path. The feedback path includes a hold circuit for extracting the signal distributed to the feedback path and holding the value of the power of the extracted signal when the power reaches a predetermined value. A control signal for attenuating the power of the input signal inputted to the main path is generated by the hold circuit and is applied through the feedback path to the variable attenuator on the main path to control the power of the input signal. A transfer function of the closed loop has a Gaussian characteristic.

49 Claims, 10 Drawing Sheets

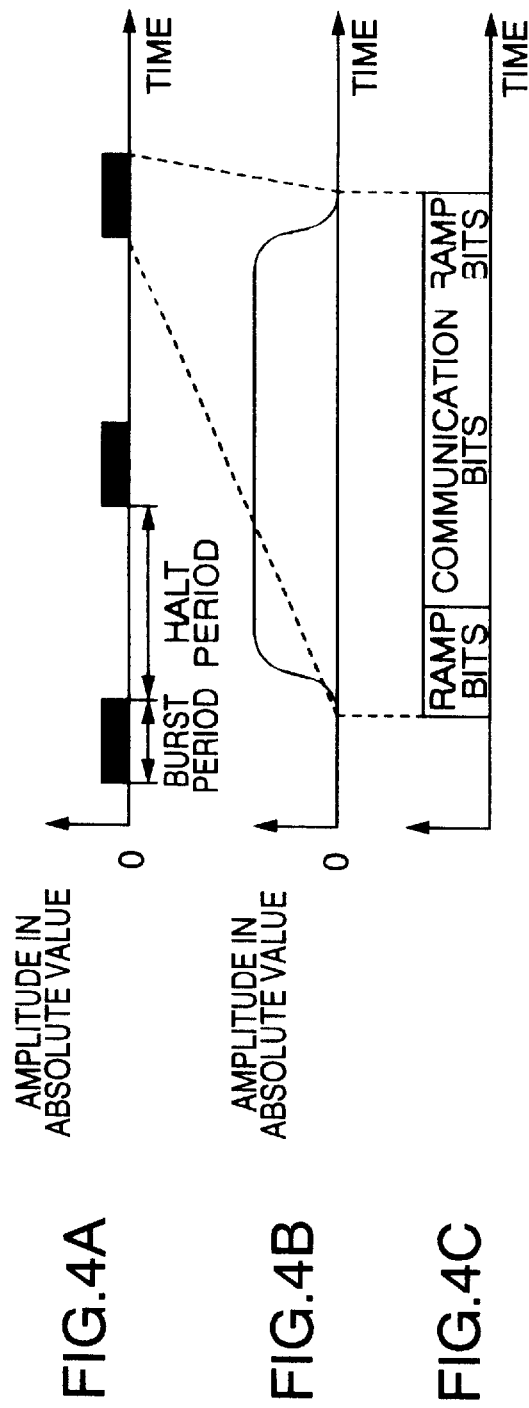

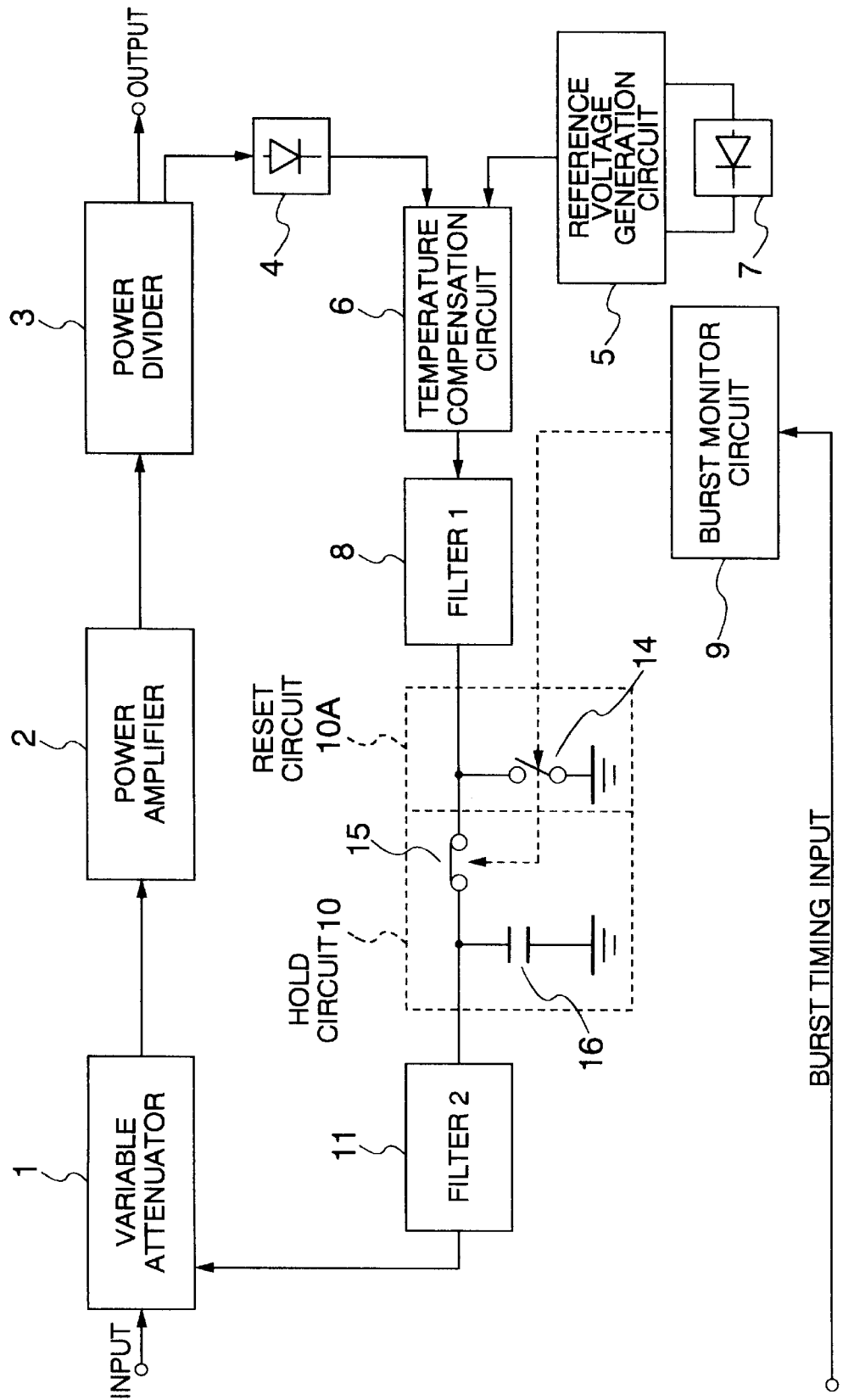

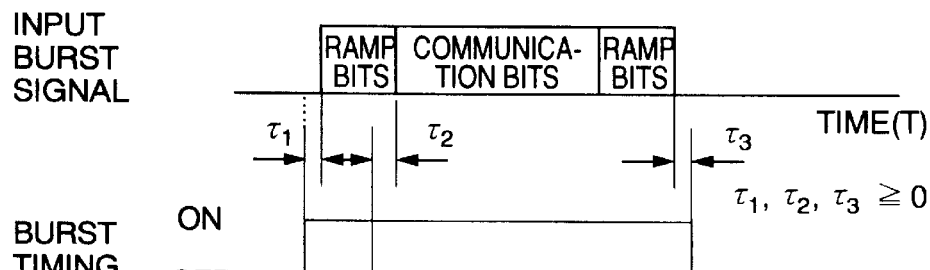
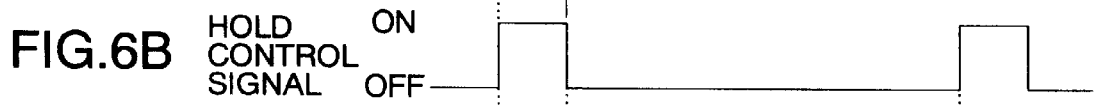
FIG.6A BURST TIMING
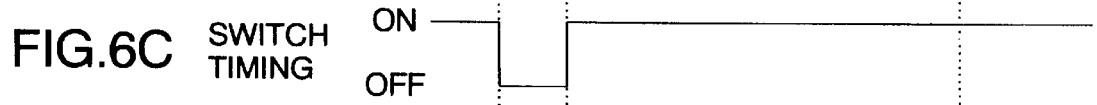
FIG.6B HOLD CONTROL SIGNAL
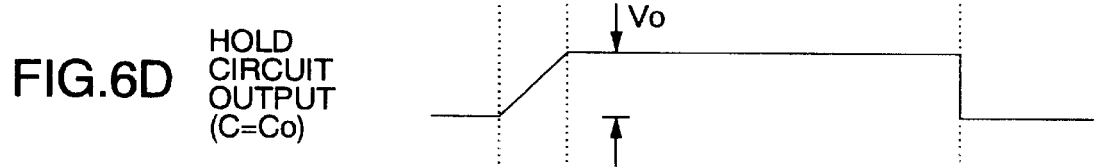
FIG.6C SWITCH TIMING
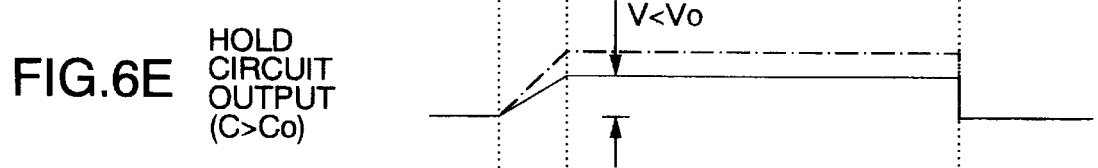
FIG.6D HOLD CIRCUIT OUTPUT ($C=C_o$)
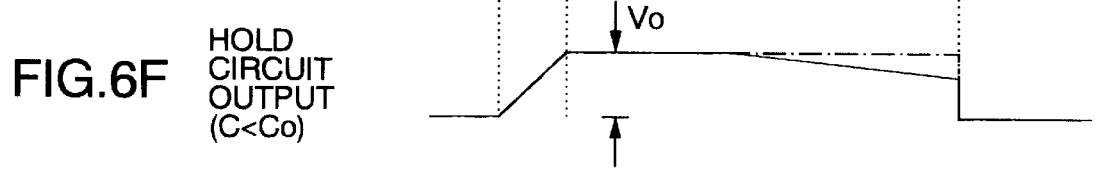
FIG.6E HOLD CIRCUIT OUTPUT ($C>C_o$)
FIG.6F HOLD CIRCUIT OUTPUT ($C<C_o$)

5,854,971

OUTPUT-CONTROLLED POWER AMPLIFIER, RADIO COMMUNICATION TERMINAL AND RADIO COMMUNICATION BASE STATION

BACKGROUND OF THE INVENTION

The present invention relates to an output-controlled power amplifier in which its output is held constant, and more particularly to an output-controlled power amplifier applied to a communication equipment in which an output signal is provided in the form of a burst signal, a radio communication terminal in which such an output-controlled power amplifier is used and a radio communication base station in which such an output-controlled power amplifier is used.

In recent years, techniques for transmitting a large amount of information in a frequency band used by the same radio system have been developed actively with the development of personal radio systems represented by portable telephones or handyphones. A radio communication system based on time division multiple access (TDMA), which is one of such techniques, is being put to practical use as one of digital radio systems. In the TDMA radio communication system, time division multiplexing is made at the same frequency to increase the efficiency of information transmission.

In the TDMA radio communication system, a base station communicating with one user or a terminal possessed by one user provides a burst signal output which has not a time continuity. In order to suppress waves interfering with another user or to maintain a speech or communication quality, it is desired for each radio equipment or station to provide a constant output in one burst. In this case, there is required a transition on a time basis from a state in which the radio equipment provides no output (also called halt period) to a state in which the radio equipment provides a constant output in one burst period. If the transition between the two states is not effected in a short time, the efficiency of information transmission is lowered since a time area unavailable for communication is increased. Accordingly, in order to improve the information transmission characteristic of the digital radio communication system, it is very important to make a high-speed state transition from the state in which no signal is outputted to the state in which a burst signal having a constant output is provided or the shortening of a rise time from a state in which a power amplifier in the output stage of a radio equipment provides no signal to a state in which the power amplifier provides a signal having a constant amplitude.

The conventional power amplifier in the output stage of a radio equipment used in a digital radio communication system has a circuit construction in which the power amplifier includes a variable attenuator in its front stage and a power divider in its rear stage and one output branching or diverging from the power divider is compared with a reference voltage so that the amount of attenuation by the variable attenuator is increased or decreased in accordance with the result of comparison.

This construction of the conventional power amplifier can be regarded as being a single closed-loop circuit which has branch points including an input and output terminals of the variable attenuator, a control signal input inputted to the variable attenutor, and one input and two outputs of the power divider. See for example JP-A-3-154430. This closed-loop circuit is not optimized for the waveform of a signal transferred in the loop. Accordingly, there is a first problem that in the case where a feedback loop is established, it does not necessarily follow that a pull-in time of the loop becomes the shortest on the order of 5 to 10 μs.

In general, an electrical signal outputted through the power amplifier having the above construction has been subjected to modulation and hence the amplitude of the signal has a local change. Therefore, even if the amplitude value of a signal transferred in the feedback loop is converged once, the action of suppressing the change in amplitude of a signal transferred in the closed loop due to the modulation may be continued successively. Namely, a feedback action of suppressing this change in signal amplitude caused by the modulation is newly generated in the loop to cause a new change in amplitude. This provides a second problem that the new varying component caused from the newly generated feedback action is superimposed on the output waveform of the power amplifier as noises for a modulated signal, thereby deteriorating the quality of a signal outputted from the radio equipment.

Further, in the conventional radio communication terminal and the conventional radio communication base station, its performance is restricted by the operating speed of the power amplifier and noises in the loop. Namely, there is a third problem that the power amplifier treads on the bottleneck of the performance of the radio communication terminal or base station.

SUMMARY OF THE INVENTION

An object of the present invention is to provide an output-controlled power amplifier in which the transition from a non-signal state to a signal state having a constant burst output value can be made at a high speed in a system such as a radio communication system which handles burst signals.

Another object of the present invention is to provide an output-controlled power amplifier with single closed-loop circuit in which noises caused from a change in amplitude can be suppressed in such a manner that after the amplitude value of a signal transferred in a closed loop has been converged, the modulated amplitude of a signal in the loop is held which successively continues.

A further object of the present invention is to provide a radio communication terminal in which a higher-speed transmission of information and an improved signal-to-noise ratio are realized by using the output-controlled power amplifier of the present invention.

A still further object of the present invention is to provide a radio communication base station in which a higher-speed transmission of information and an improved signal-to-noise ratio are realized by using the output-controlled power amplifier of the present invention.

In an output-controlled power amplifier according to one aspect of the present invention made for attaining the above object, a signal distributed to a feedback path diverging from a main path is extracted and a signal generated by holding the value of the power (or amplitude) of the extracted signal when the power (or amplitude) reaches a predetermined value is outputted to the feedback path as a control signal which makes a power control or attenuates the power of an input signal inputted to the main path.

An output-controlled power amplifier according to another aspect of the present invention comprises a hold circuit for extracting a signal distributed to a feedback path diverging from a main path, holding the value of the power of the extracted signal when the power reaches a predetermined value, and outputting to the feedback path a control signal which attenuates the power of an input signal inputted to the main path, and a burst monitor circuit connected to the hold circuit for making a reset and hold control of the hold circuit on the basis of a burst timing signal inputted from the exterior, the power of the input signal to the main path being controlled to a desired value or attenuated on the basis of the control signal outputted from the hold circuit to the feedback path.

An output-controlled power amplifier according to a further aspect of the present invention comprises a variable attenuator inputted with an input signal for attenuating the power of the input signal to output the attenuated signal, a power amplifier connected to the variable attenuator for amplifying an output signal of the variable attenuator to output the amplified signal, a power divider connected to the power amplifier for dividing an output signal of the power amplifier into a plurality of outputs to provide the plurality of outputs, an envelope detector connected to the power divider for envelope-detecting an output signal provided by the power divider to output the envelope-detected signal, a temperature compensation circuit connected to the envelope detector for holding the conversion gain of the envelope detector for temperature change constant, a filter connected to the temperature compensation circuit for waveform-shaping an output signal of the temperature compensation circuit to output the waveform-shaped signal, a reference voltage generation circuit connected to the temperature compensation circuit for generating a reference voltage and applying the reference voltage to the temperature compensation circuit, a hold circuit connected to the filter for extracting or holding an output signal of the filter, and a burst monitor circuit connected to the hold circuit for controlling the hold circuit on the basis of a burst timing signal inputted from the exterior, the hold circuit being connected to the variable attenuator so that the variable attenuator attenuates the power of the input signal on the basis of an output signal of the hold circuit.

In one embodiment of the output-controlled power amplifier according to the present invention, a burst signal is inputted as the input signal and the hold circuit brings its output to a voltage level in a halt period after the burst signal is outputted to the exterior.

In another embodiment of the output-controlled power amplifier according to the present invention, the hold circuit makes the extraction of the output of the amplifier on the basis of a predetermined time.

In a further embodiment of the output-controlled power amplifier according to the present invention, a closed-loop transfer function of the output-controlled power amplifier is a Gaussian characteristic function approximately.

In a still further embodiment of the output-controlled power amplifier according to the present invention, the pole of a closed-loop transfer function of the output-controlled power amplifier has a Gaussian characteristic approximately.

According to a still further aspect of the present invention, there is provided a radio communication terminal which includes the output-controlled power amplifier of the present invention.

According to a furthermore aspect of the present invention, there is provided a radio communication base station which includes the output-controlled power amplifier of the present invention.

In operation, the output power of the output-controlled power amplifier of the present invention is converged within a fixed time to a constant value determined by the reference voltage generation circuit. After the output of the output-controlled power amplifier has been converged to the predetermined constant value, the output of the hold circuit is forcibly held at a constant value and hence the attenuation of the variable attenuator is also held constant. Namely, the closed loop is equivalently disconnected. Therefore, even if a signal transferred in the power amplifier through the variable attenuator involves a change in amplitude caused from modulation, no feedback action of suppressing this change is generated. Accordingly, there is solved the problem in the prior art that a new varying component caused from the feedback action for suppression of the change caused by the modulation is superimposed. As a result, the signal-to-noise ratio of the output-controlled power amplifier is improved.

With the construction of the output-controlled power amplifier of the present invention, the convergence of the amplitude of a signal wave by a feedback can be realized at a high speed by making a circuit design so that the waveform of a signal transferred in the closed loop at the time of establishment of the feedback loop assumes a Gaussian waveform or a normal distribution waveform. The realization of the Gaussian waveform or the normal distribution waveform for the signal waveform transferred in the closed loop can be made by providing the closed-loop gain or closed-loop transfer function of the feedback loop with a Gaussian function or a normal distribution function. In general, the Gaussian function is realized by a linear coupling of transfer functions having infinite real numbers. Therefore, it is very difficult to accurately realize a circuit the closed-loop transfer function of which takes the Gaussian function. However, the normal distribution function exhibits a very rapid attenuation with the increase of the absolute value of an independent variable of the function. Therefore, the approximation can be attained with a very high precision by the lower-order Taylor expansion of the normal distribution function concerning the independent variable.

Accordingly, the high-speed convergence of the amplitude of a signal wave by the feedback can be realized in such a manner that the closed-loop transfer function of the output-controlled power amplifier at the time of establishment of a feedback loop is provided with an approximate function of the normal distribution function.

The high-speed ability of amplitude convergence is maintained if the pole of the closed-loop transfer function is the same as that of the Gaussian function or the normal distribution function. Therefore, the high-speed convergence of the amplitude of a signal wave by the feedback can also be realized by providing the pole of the closed-loop transfer function with the pole of an approximate function of the normal distribution function obtained by making the second-order or third-order Taylor expansion of the normal distribution function.

The other objects, features and advantages of the invention will become apparent when reading the following embodiments taken in conjunction with the accompanying drawings.

BRIEF DESCRIPTION OF THE DRAWINGS

FIGS. 4A to 4C are diagrams showing the timing of transmission of transmit bits of a burst signal in a TDMA radio communication system to which the output-controlled power amplifier of the embodiment shown in FIG. 1, 2 or 3 is applied;

FIG. 5 is a block diagram showing the construction of a still further embodiment of the output-controlled power amplifier according to the present invention;

FIGS. 6A to 6F are timing diagrams explaining the operations of a burst monitor circuit and the hold circuit in the output-controlled power amplifier of the embodiment shown in FIG. 5;

DESCRIPTION OF THE PREFERRED EMBODIMENTS

Figure 1:
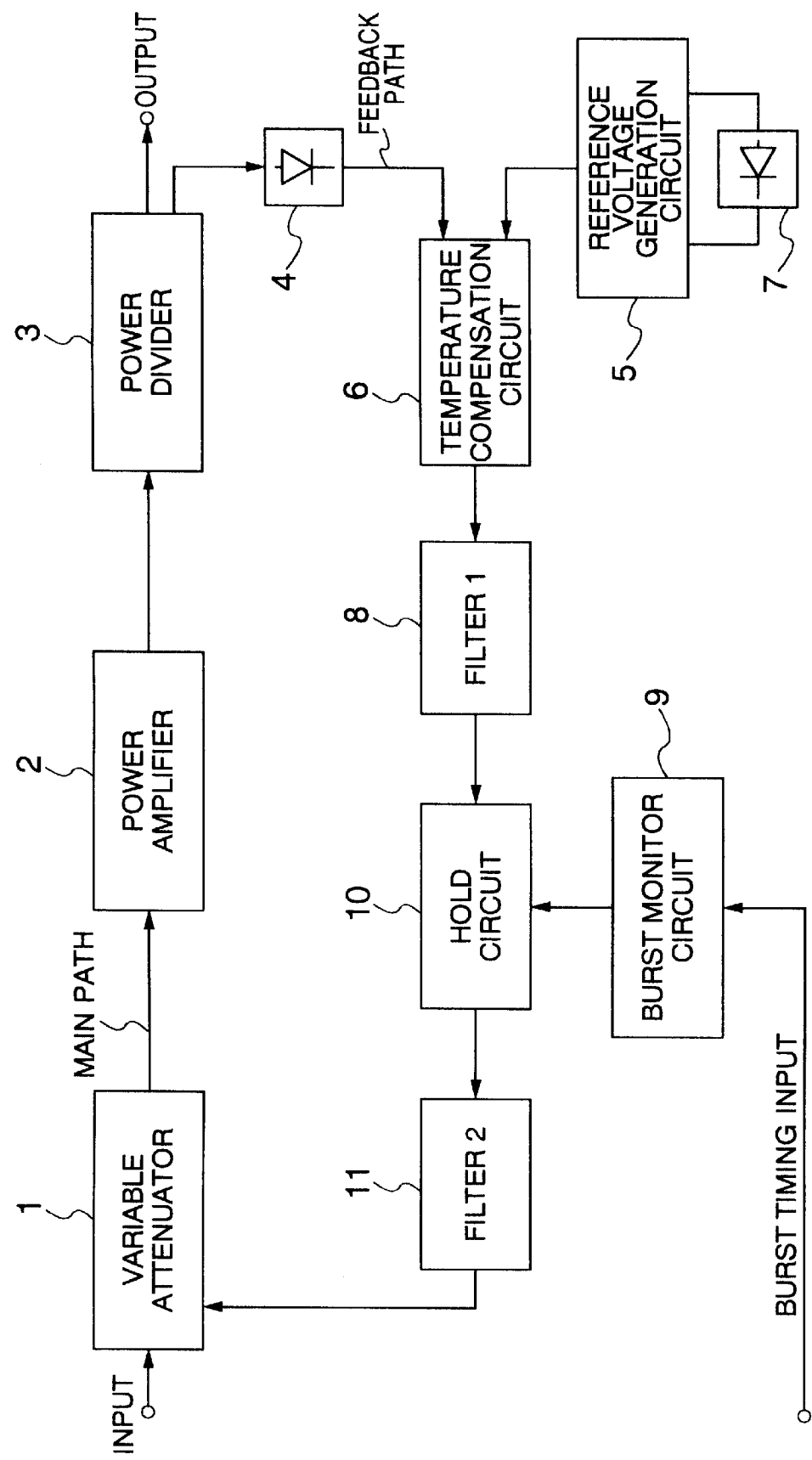
FIG. 1 is a block diagram showing the construction of an embodiment of an output-controlled power amplifier according to the present invention.

One embodiment of the present invention will be explained using FIGS. 1 to 3 and FIGS. 4A to 4C. FIG. 1 is a block diagram showing the construction of an embodiment of an output-controlled power amplifier according to the present invention. A variable attenuator 1, a power amplifier 2 and a power divider 3 are provided on a main path. The variable attenuator 1 attenuates an input signal to a desired power in accordance with a control signal. The power amplifier 2 performs power amplification. The power divider 3 receives a power inputted from one input end thereof and divides or distributes it between the main path and a feedback path diverging from the main path so that the divisional powers are outputted to two output ends. An envelope detector 4 on the feedback path extracts the amplitude components of a signal inputted thereto. A diode 7 has the same DC voltage drift versus temperature characteristic as the envelope detector 4. A reference voltage generation circuit 5 includes a DC voltage source connected to the diode 7 and generates a reference voltage for differential detection made by a temperature compensation circuit 6. Usually, the compensation for temperature is made to suppress a level error within, for example, ±5 db in a temperature range between −20° C. and 75° C. The temperature compensation circuit 6 makes the differential detection of two input signals to cancel the DC voltage drift versus temperature characteristic of the envelope detector 4, thereby holding the output of the output-controlled power amplifier constant for the variations in temperature. Each of first and second filters 8 and 11 makes signal band limitation. A burst monitor circuit 9 generates a signal for control of a hold circuit 10 from a burst timing signal. The burst timing signal is a signal for making the coincidence of a generated input burst signal as shown in FIG. 4B and the timing of operation of the output-controlled power amplifier. This burst timing signal is generated in synchronism with the input burst signal. The hold circuit 10 makes the extraction or hold of a feedback signal or the reset of the feedback path in accordance with a control signal from the burst monitor circuit 9.

In the above construction, the main path includes the cascade connection of the variable attenuator 1, the power amplifier 2 and the power divider 3. To the main path are connected the envelope detector 4 and the temperature compensation circuit 6 which are in turn connected to the feedback path which is another output of the power amplifier 3. The temperature compensation circuit 6 has a first input connected to an output of the envelope detector 4 which may include a diode. A second input of the temperature compensation circuit 6 is connected to an output of the reference voltage generation circuit 5 to which the diode 7 having the same DC voltage drift versus temperature characteristic as the envelope detector 4 is connected. An output of the temperature compensation circuit 6 is connected through the first filter 8 to an input of the hold circuit 10 controlled by a control signal which is the output of the burst monitor circuit 9. An output of the hold circuit 10 is inputted to the second filter 11. An output of the second filter 11 to the feedback path provides a feedback path signal or a control signal to the variable attenuator 1, thereby establishing a closed loop or the feedback path.

Figure 2:
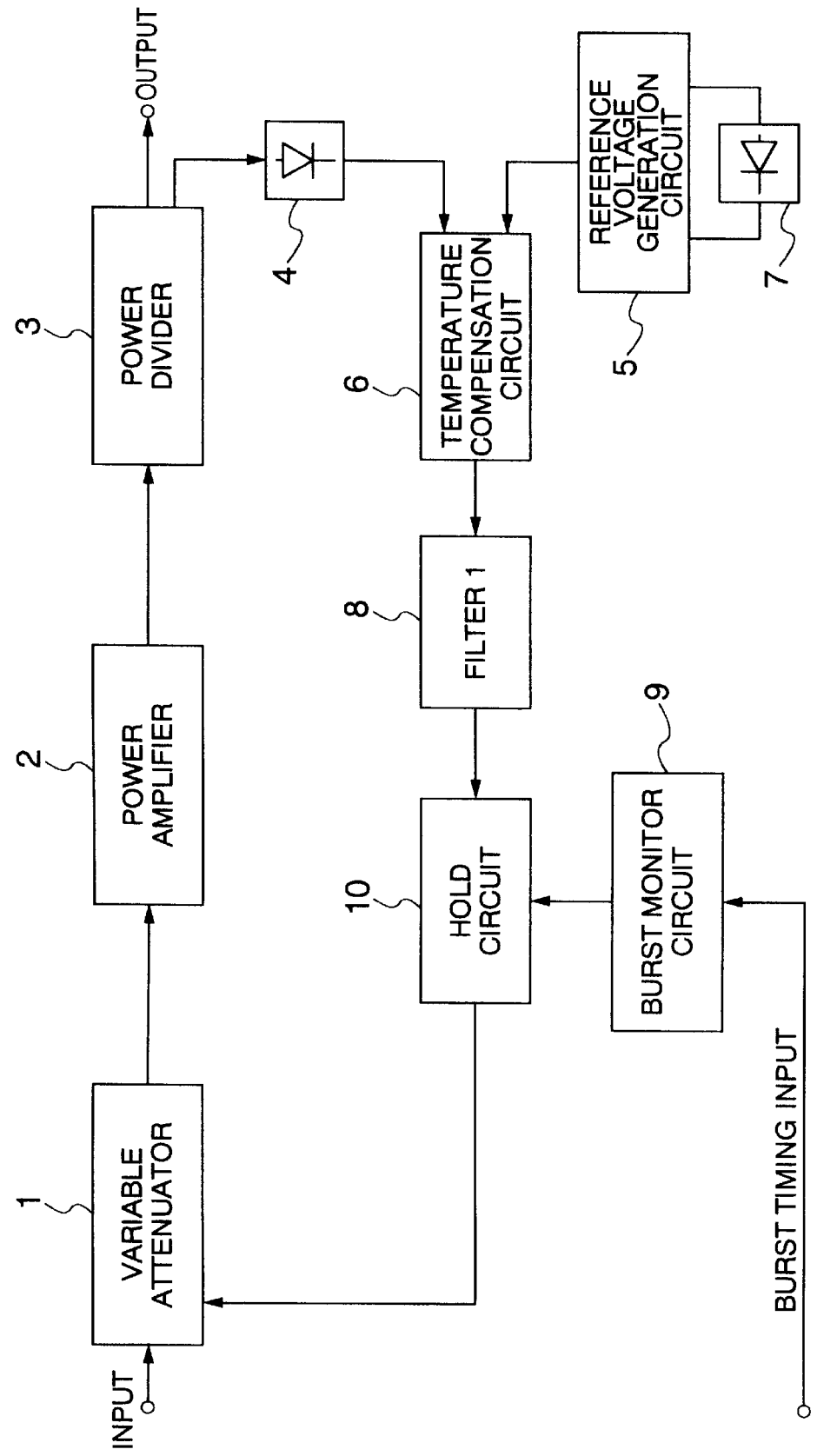
FIG. 2 is a block diagram showing the construction of another embodiment of the output-controlled power amplifier according to the present invention.

FIG. 2 is a block diagram showing the construction of another embodiment of an output-controlled power amplifier according to the present invention. In the present embodiment, the second filter 11 shown in FIG. 1 is omitted while a control signal of the variable attenuator 1 is generated by the hold circuit 10.

Figure 3:
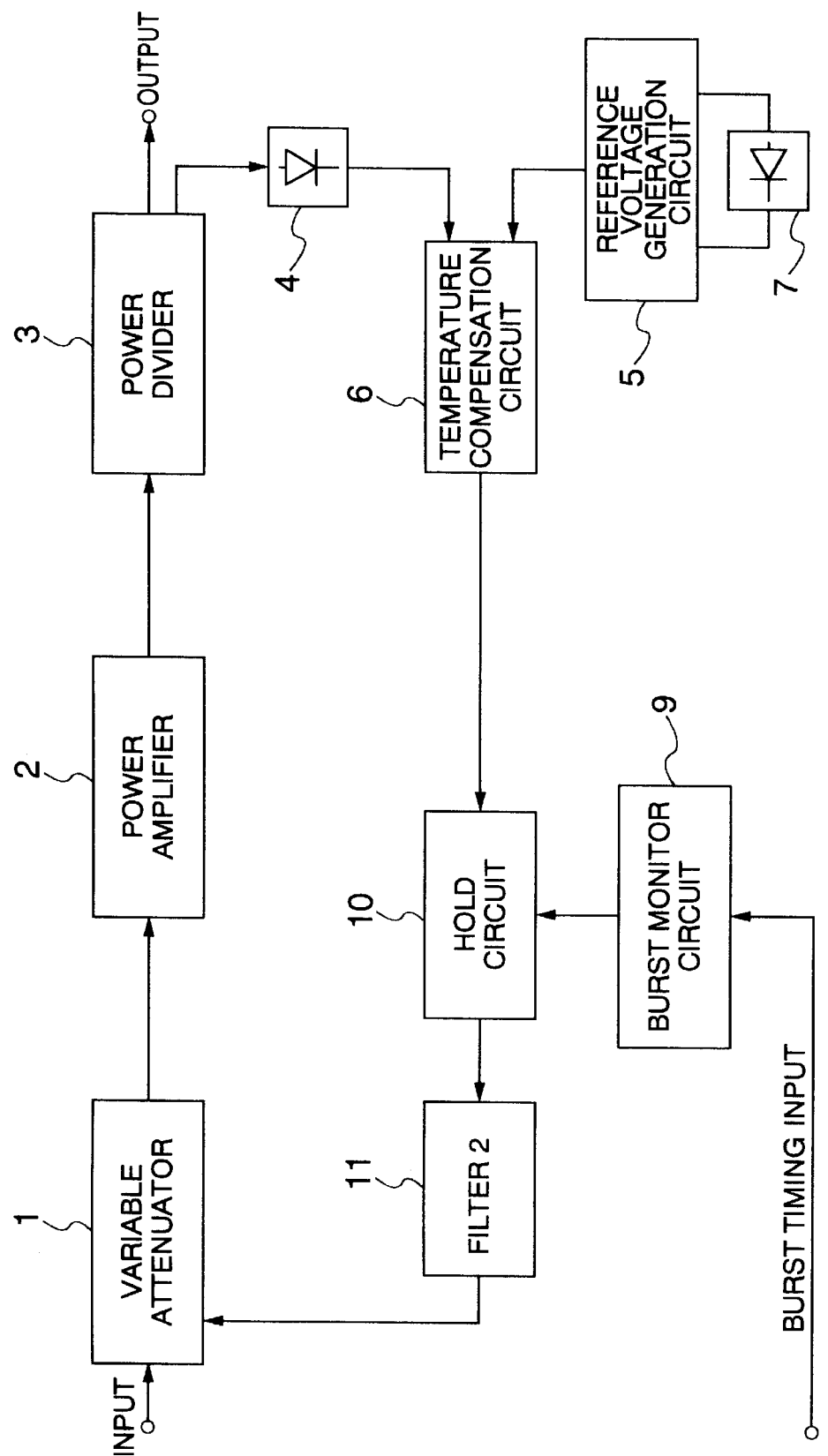
FIG. 3 is a block diagram showing the construction of a further embodiment of the output-controlled power amplifier according to the present invention.

FIG. 3 is a block diagram showing the construction of a further embodiment of an output-controlled power amplifier according to the present invention. In the present embodiment, the first filter 8 shown in FIG. 1 is omitted while an output of the temperature compensation circuit 6 is inputted to the hold circuit 10.

FIGS. 4A to 4C are diagrams for explaining a signal inputted to the output-controlled power amplifier of the present invention. FIG. 4A shows an example of an input burst transmit signal train in the TDMA communication. FIG. 4B shows one input burst transmit signal in a form enlarged on the time axis. FIG. 4C shows the types of transmit information in the input burst transmit signal.

An embodiment of the operation of the output-controlled power amplifier according to the present invention will be explained using FIGS. 4A to 4C. By way of example, the explanation will be made in conjunction with the case where a burst transmit signal train as shown in FIG. 4A is inputted. In a halt period in FIG. 4A or when a burst signal is not transmitted, the burst monitor circuit 9 turns the hold circuit 10 to a holding state in which the output of the hold circuit 10 is held as set to a predetermined constant value. At this time, the amount of attenuation by the variable attenuator 1 is held at a constant value.

Timing with the start of transmission of the burst signal or on the basis of a burst timing signal which may be an input itself or may be generated by a controller or the like (not shown) capable of monitoring the input, the burst monitor circuit 9 sends a control signal to the hold circuit 10 so that the hold circuit 10 is turned into a signal extracting state. From this point of time, a closed loop including the main path and the feedback path is established. At the times of rising and falling of the burst signal, the burst signal transmits ramp bits irrelevant to the transmission of information, as shown in FIG. 4C. The operation of the feedback loop is performed during a period of time when the ramp bits at the time of rising of the burst signal are transmitted. In the output-controlled power amplifier of the present invention, the output voltage of the envelope detector 4 is controlled so that it becomes equal to a voltage determined by the reference voltage generation circuit 5. Therefore, an output power of the output-controlled power amplifier is converged to a predetermined constant value during the ramp bit transmit period.

The inputted burst transmit signal is attenuated by the variable attenuator 1, amplified by the power amplifier 2, fed back by the power divider 3, envelope-detected by the envelope detector 4 and thereafter subjected to temperature compensation by the temperature compensation circuit 6. The temperature compensation is made through the comparison with an output of the reference voltage generation circuit 5 which is connected to the second diode 7 having the same temperature characteristic as the first diode or envelope detector 4. An output of the temperature compensation circuit 6 is subjected to waveform shaping by the first filter 8 and the second filter 11 through the hold circuit 10 which serves a buffer at the time of establishment of the closed loop. The signal thus transferred in the feedback loop has a Gaussian waveform approximately.

At the timing of transmission of a communication bit train in the burst signal which is used for the transmission of communication or when the transmission of ramp bits is completed, the burst monitor circuit 9 sends a control signal to the hold circuit 10 so that the hold circuit 10 is turned into a holding state. At this time, the output power of the output-controlled power amplifier has been converged to the predetermined constant value. Accordingly, the hold circuit 10 holds this converged value as the output of the hold circuit. Therefore, the amount of attenuation by the variable attenuator 1 applied with the output of the hold circuit 10 as a control signal is also held at a constant value. Namely, the output power of the output-controlled power amplifier is held at a constant value. The state of an output level reaching this constant value corresponds to a rising waveform shown in FIG. 4B.

When the radio communication equipment completes the transmission of the burst signal, the burst monitor circuit 9 resets the output of the hold circuit 10 to a predetermined initial value or turns the hold circuit 10 into a reset-hold state. Thereby, the radio communication equipment returns to a state in which no burst signal is transmitted.

In the present embodiment, when the hold circuit 10 is in the signal extracting state, the waveform of a signal transferred in the closed loop is approximately held in a Gaussian waveform since the element values of the first and second filters 8 and 11 are determined such that a closed-loop transfer function of the closed loop assumes a function obtained by the Taylor expansion of a Gaussian function up to the third order thereof (or a higher order than that). At this time, the element values of the first and second filters 8 and 11 may be determined such that the pole of a closed-loop transfer function of the closed loop assumes the pole of a function obtained by the Taylor expansion of a Gaussian function up to the third order thereof (or a higher order than that). In the output-controlled power amplifier in the embodiment of FIG. 2 or 3 which includes only the first filter 8 or the second filter 11, the element value of the first or second filter 8 or 11 may be determined such that a closed-loop transfer function of the closed loop assumes a function obtained by the Taylor expansion of a Gaussian function up to the third order thereof (or a higher order than that). With the above operation of the output-controlled power amplifier of the present invention, an input signal such as that shown in FIG. 4B can be amplified to a predetermined constant transmit output power and this signal waveform (for example, in the case of an input signal as shown in FIG. 4B) is outputted with a predetermined amplitude value.

According to the present embodiment, after the output of the output-controlled power amplifier has been converged to a predetermined constant value, the output of the hold circuit 10 is forcibly held at a constant value and the attenuation of the variable attenuator 1 is also held constant. Therefore, even if a signal transferred in the power amplifier 2 through the variable attenuator 1 involves a change in amplitude caused from modulation, no feedback action of suppressing this change is generated. Accordingly, there is no possibility that a new varying component other than the change caused from the modulation is superimposed on the carrier. As a result, the signal-to-noise ratio of the output-controlled power amplifier is improved.

Also, with the construction of the output-controlled power amplifier of the present invention, since a signal waveform transferred in the closed loop is approximately held in a Gaussian waveform, the realization of high-speed convergence of the amplitude of a signal wave by a feedback is also attained by the present embodiment.

FIG. 5 is a block diagram showing the construction of a still further embodiment of the output-controlled power amplifier according to the present invention. FIGS. 6A to 6F are waveform diagrams for explaining the operation of the embodiment shown in FIG. 5.

A hold circuit 10 includes a hold switch 15 and a hold capacitor 16. A feedback loop reset circuit 10A includes a reset switch 14. One end of the switch 15 and one end of the switch 14 are connected to an output of the filter 8. The other end of the switch 14 is grounded. The other end of the switch 15 is connected to one end of the hold capacitor 16 to provide an output of the hold circuit 10. The other end of the hold capacitor 16 is grounded. The switches 14 and 15 are controlled by an output signal of the burst monitor circuit 9.

FIG. 6A shows a timing relation between a burst timing signal and an input burst signal with time gaps (lags) $\tau_1$, $\tau_2$ and $\tau_3$ by way of example. FIG. 6B shows a hold control signal which is the output of the burst monitor circuit 9. FIG. 6C shows a switch timing which is the output of the burst monitor circuit 9. FIG. 6D shows an output voltage of the hold circuit 10 when the capacitance of the capacitor 16 is its optimum value. FIG. 6E shows an output voltage of the hold circuit 10 when the capacitance of the capacitor 16 is greater than the optimum value. FIG. 6F shows an output voltage of the hold circuit 10 when the capacitance of the capacitor 16 is smaller than the optimum value.

When the burst timing signal shown in FIG. 6A is turned on, an output signal is transmitted. When the burst timing signal is turned off, the transmission of the output signal is stopped. The switch 15 takes a turned-on condition when the hold control signal shown in FIG. 6B is turned on and the same switch 15 takes a turned-off condition when the hold control signal is turned off. The switch 14 takes a turned-off condition when the burst timing signal is turned on and the hold control signal is turned on (see FIG. 6C).

The output voltage of the hold circuit 10 in its hold state is determined by the capacitance of the capacitor 16. In the case where the capacitance of the capacitor 16 is smaller than the optimum value, the capacitor is charged at the earlier stage of a ramp bit transmission time in FIG. 4C but there is generated a phenomenon that the output voltage of the hold circuit 10 drops during a burst signal transmission time (see FIG. 6F). This phenomenon is called sag and brings about a change in output power. On the other hand, in the case where the capacitance of the capacitor 16 is greater than the optimum value, the convergence time of the feedback loop is elongated so that the convergence is not obtained within the ramp bit transmission time (see FIG. 6E). Accordingly, in order to obtain the output voltage characteristic of the hold circuit as shown in FIG. 6D, it is required that the capacitance of the capacitor 16 should be determined in accordance with a transfer function of the feedback loop, the ramp bit transmission time and the burst transmit signal transmission time so that it has the optimum value.

Figure 7:
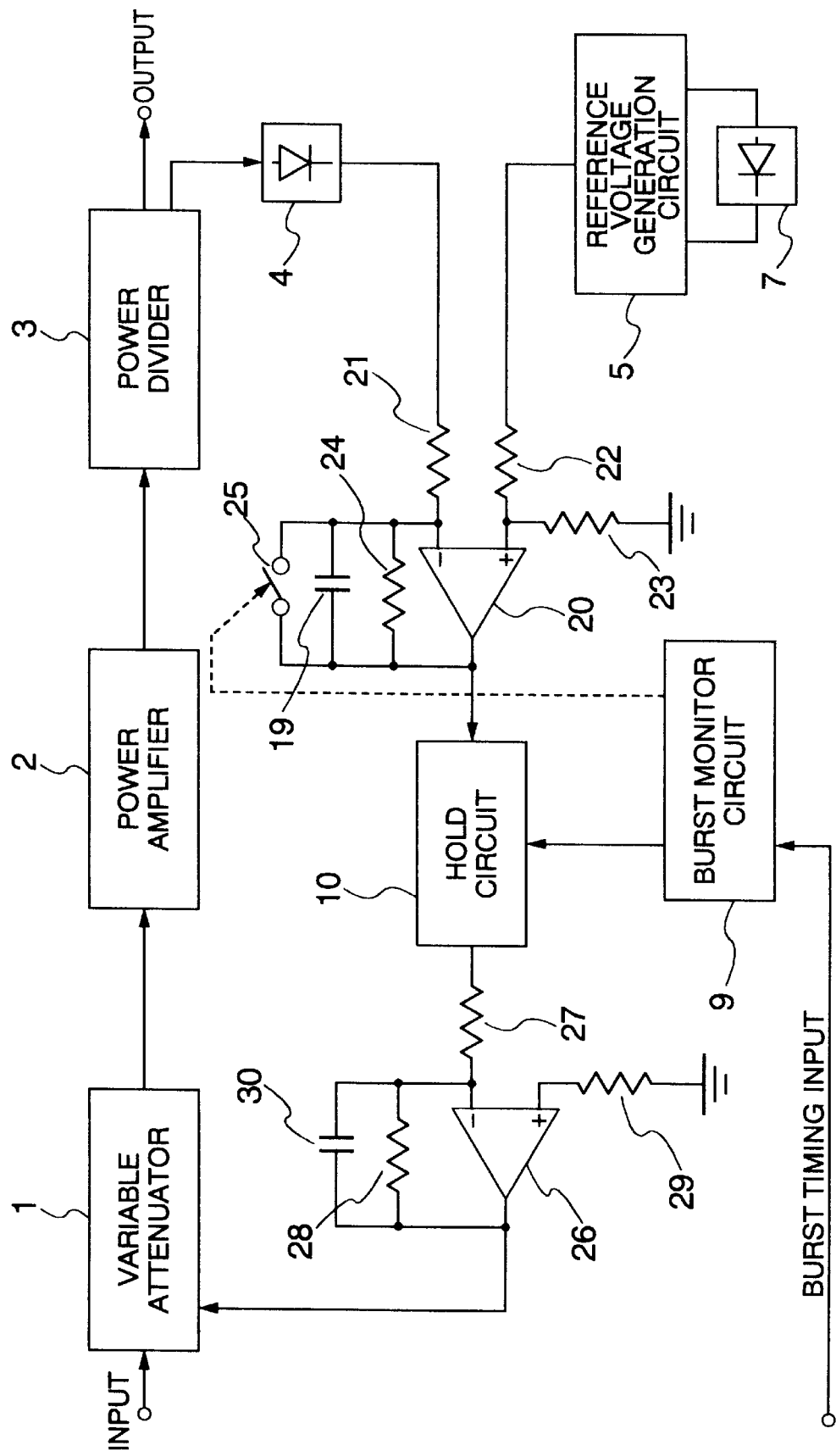
FIG. 7 is a block diagram showing the construction of a further embodiment of the output-controlled power amplifier according to the present invention.

FIG. 7 is a block diagram showing the construction of a further embodiment of the output-controlled power amplifier according to the present invention.

The connection circuit of the temperature compensation circuit 6 and the filter 8 is composed of an operational amplifier 20, resistors 21, 22, 23 and 24, a capacitor 19, and a loop reset switch 25. An output of the envelope detector 4 is connected to a negative input of the operational amplifier 20 through the resistor 21. A positive input of the operational amplifier 20 is grounded through the resistor 23. An output of the reference signal generation circuit 5 is connected to the positive input of the operational amplifier 20 through the resistor 22. The switch 25, the resistor 24 and the capacitor 19 are connected in parallel between the negative input of the operational amplifier 20 and the output thereof. An output of this circuitry is connected to the hold circuit 10. The filter 11 is composed of an operational amplifier 26, resistors 27, 28 and 29, and a capacitor 30. An output of the hold circuit 10 is connected to a negative input of the operational amplifier 26 through the resistor 27. A positive input of the operational amplifier 26 is grounded through the resistor 29. The capacitor 30 and the resistor 28 are connected in parallel between the negative input of the operational amplifier 26 and the output thereof. An output of this circuitry provides a control signal for the variable attenuator 1.

The operation of the present embodiment is different from the operation of the embodiment of FIG. 5 in that the switch 14 in the reset circuit 10A is always in an opened condition and the operation shown in FIG. 6C is performed by the switch 25 in lieu of the switch 14. At the time of rising of a burst signal, the switch 25 assumes a turned-on condition. Therefore, an output of the hold circuit 10 at this time is substantially equal to an output voltage of the envelope detector 4 when there is no input. In the present embodiment, the amplification factor of an amplifier as an active filter constructed by the operational amplifier 20 and the resistors 21 and 24 is selected to be sufficiently large so that an output of the active filter at the time of turn-on of the switch 25 comes near to zero. Thereby, an operation similar to that of the switch 14 can be expected.

Figure 8:
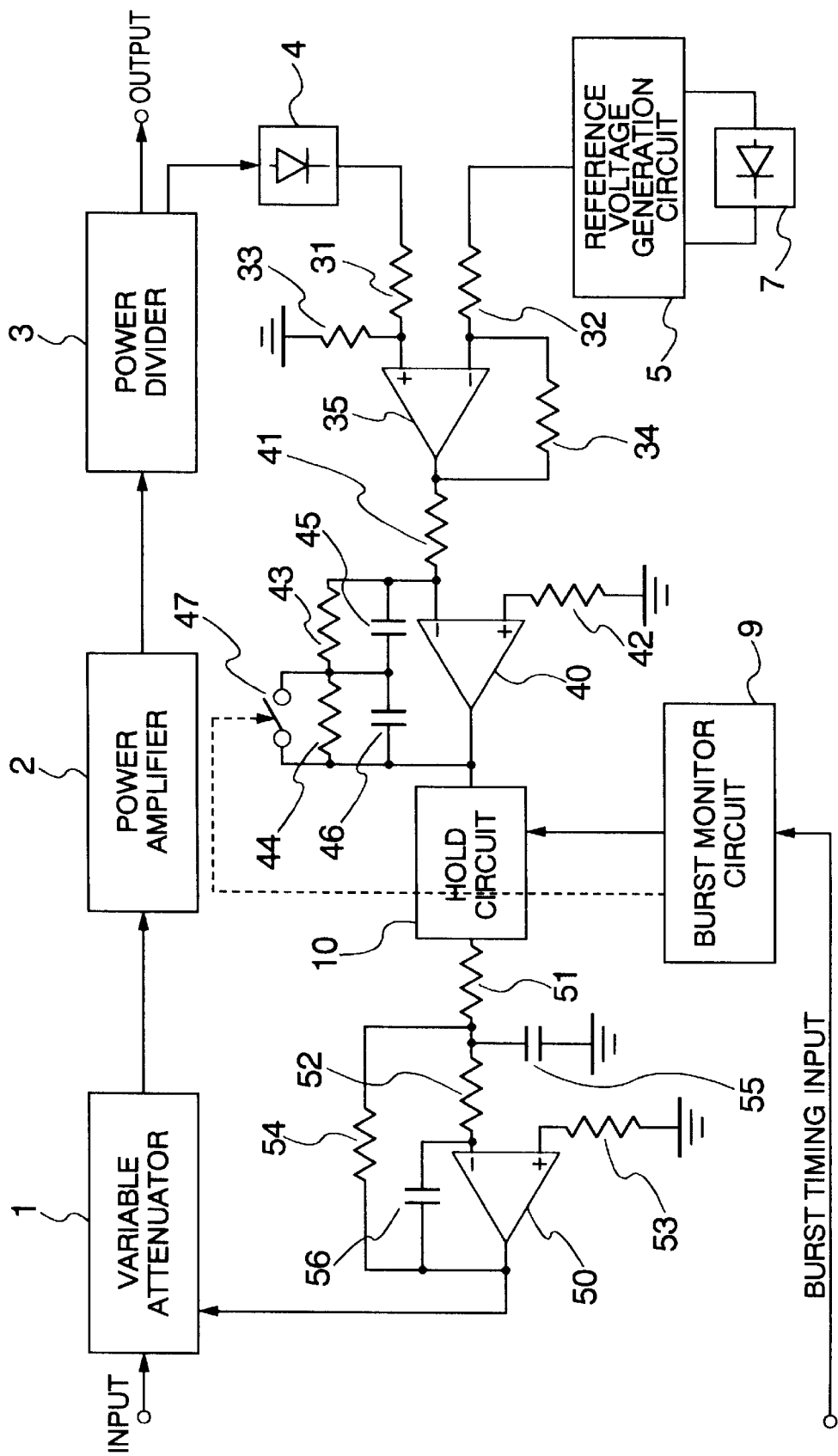
FIG. 8 is a block diagram showing the construction of a still further embodiment of the output-controlled power amplifier according to the present invention.

FIG. 8 is a block diagram showing the construction of a still furthermore embodiment of the output-controlled power amplifier according to the present invention.

The connection circuit of the temperature compensation circuit 6 and the filter 8 is composed of operational amplifiers 35 and 40, resistors 31, 32, 33, 34, 41, 42, 43 and 44, capacitors 45 and 46, and a loop reset switch 47. An output of the envelope detector 4 is connected to a positive input of the operational amplifier 35 through the resistor 31. The positive input of the operational amplifier 35 is grounded through the resistor 33. An output of the reference signal generation circuit 5 is connected to a negative input of the operational amplifier 35 through the resistor 32. The resistor 34 is connected between the negative input of the operational amplifier 35 and the output thereof. A positive input of the operational amplifier 40 is grounded through the resistor 42. A series connection of a parallel circuit of the switch 47, the resistor 44 and the capacitor 46 and a parallel circuit of the resistor 43 and the capacitor 45 is connected between a negative input of the operational amplifier 40 and an output thereof with an output of the switch 47 connected to the output of the operational amplifier 40. An output of this circuitry is connected to an input of the hold circuit 10. The filter 11 is composed of an operational amplifier 50, resistors 51, 52, 53 and 54, and capacitors 55 and 56. An output of the hold circuit 10 is connected to a negative input of the operational amplifier 50 through a series connection of the resistor 51 and the resistor 52. A positive input of the operational amplifier 50 is grounded through the resistor 53. The capacitor 56 is connected between the negative input of the operational amplifier 50 and the output thereof. The junction of the resistors 51 and 52 is grounded through the capacitor 53. The resistor 54 is connected between the junction of the resistors 51 and 52 and the output of the operational amplifier 50. The output of the operational amplifier 50 provides a control signal for the variable attenuator 1.

The operation of the embodiment shown in FIG. 8 is similar to that of the embodiment shown in FIG. 7. However, a secondary active filter using an operational amplifier is formed in the embodiment shown in FIG. 7 while a tertiary active filter using an operational amplifier is formed in the embodiment shown in FIG. 8. Therefore, the present embodiment shown in FIG. 8 provides an effect that the gain of the closed loop can be improved. Also, since the order of filter in the closed loop is increased, it is possible to improve the degree of approximation of the closed-loop transfer function to a Gaussian response. As a result, a time for convergence of the output of the hold circuit to a constant value can be shortened, thereby improving the applicability to a TDMA radio communication system which has a reduced number of ramp bits. In the case where the order of filter is the fourth order or higher than that, there is a merit that a change in the loop after convergence is suppressed. However, in the output-controlled power amplifier of the present invention, since the output of the hold circuit is held constant after the completion of transmission of ramp bits, almost no change is generated in the loop after convergence. Therefore, it may be considered that the order of filter up to the third order at the highest suffices. As the order of filter is lower, the circuit construction can be simplified, which is advantageous in fabrication cost.

Figure 9:
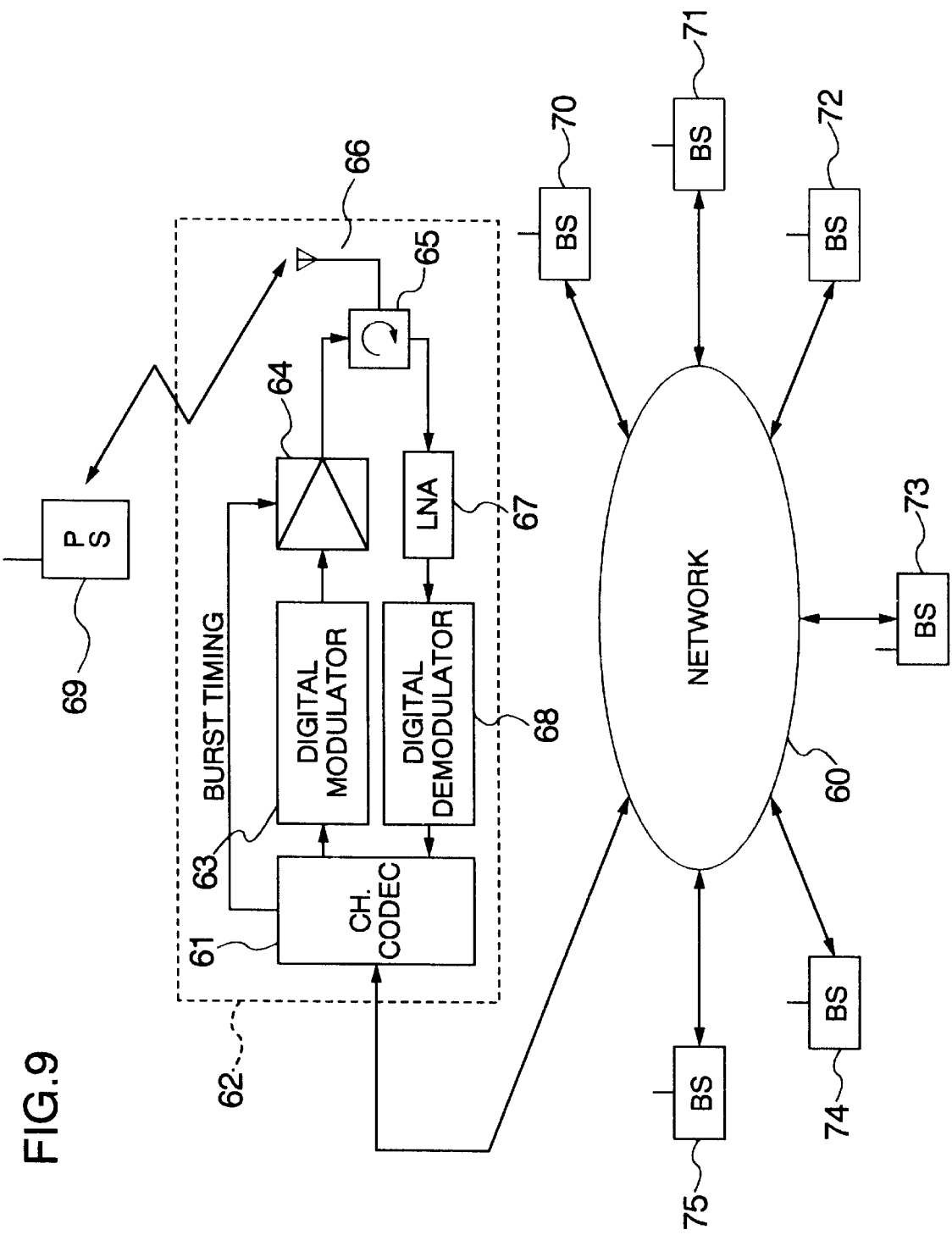
FIG. 9 is a block diagram showing the construction of an embodiment of a TDMA radio communication system in which the output-controlled power amplifier of the present invention is used.

FIG. 9 is a block diagram showing the construction of an embodiment of a TDMA radio communication system with radio base stations and radio terminals in which the output-controlled power amplifier of the present invention is used. Radio base stations 62, 70, 71, 72, 73, 74 and 75 each using the output-controlled power amplifier of the present invention are connected to a network 60. The radio base stations form a communication area in which a radio terminal 69 makes communication. One example of the application of the present invention is a personal handyphone system (PHS) which is being put into operation in Japan. Pages 1 to 43 of the standard specification of PHS in English version are incorporated by reference as the disclosure of the present application. An RF power amplifier composed of a GaAs semiconductor device handles a digital signal having a center frequency on the order of 1900 MHz.

The operation of the TDMA radio communication system of FIG. 9 using the output-controlled power amplifier of the present invention will be explained in conjunction with the case where the radio terminal 69 makes communication through the radio base station 62. Information transmitted from the network 60 enters the radio base station 62. In the radio base station 62, the signal is converted by a channel codec 61 into burst data, converted by a digital modulator 63 into a burst modulated signal, power-amplified by an output-controlled power amplifier 64 of the present invention, and thereafter sent by a circulator 65 to an antenna 66. The signal is transmitted through the antenna 66 to the radio terminal 69. The channel codec 61 transmits information to the network 60 and sends a burst timing signal to the burst monitor circuit 9 of the output-controlled power amplifier 64 to control the output-controlled power amplifier 64. The burst timing signal may be generated by a controller (not shown) which controls the channel codec 61. A burst modulated signal sent from the radio terminal 69 is transmitted to the radio base station 62 and captured by the antenna 66 therein. Then, the signal is sent by the circulator 65 to a low-noise amplifier (LNA) 67, subjected to low-noise amplification by the LNA 67, converted by a digital demodulator 68 into burst data, and thereafter transmitted by the channel codec 61.

When the communication quality of the radio communication system is taken into consideration, it is desired that the output power of the radio base station is stably maintained and controlled. In general, changes caused from temperature and frequency are known as factors of change of the output power of a radio communication equipment. Generally, the gain of a power amplifier is lowered as the temperature is higher. Also, the gain of the power amplifier changes in accordance with an operating frequency. To cope with a change in output power such as the change of the burst modulated signal power of the digital modulator 63 or the change in gain of the power amplifier 2 which may be caused from a temperature change or a frequency change, the present embodiment makes a control for the amount of attenuation by the variable attenuator 1 of the output-controlled power amplifier 64 so that the change in output power is cancelled to hold the output power always constant. Thereby, the communication area can be established stably and the variations of interference to the neighboring radio base stations 70, 71, 72, 73, 74 and 75 are reduced. As a result, the communication quality of the system is improved.

Figure 10:
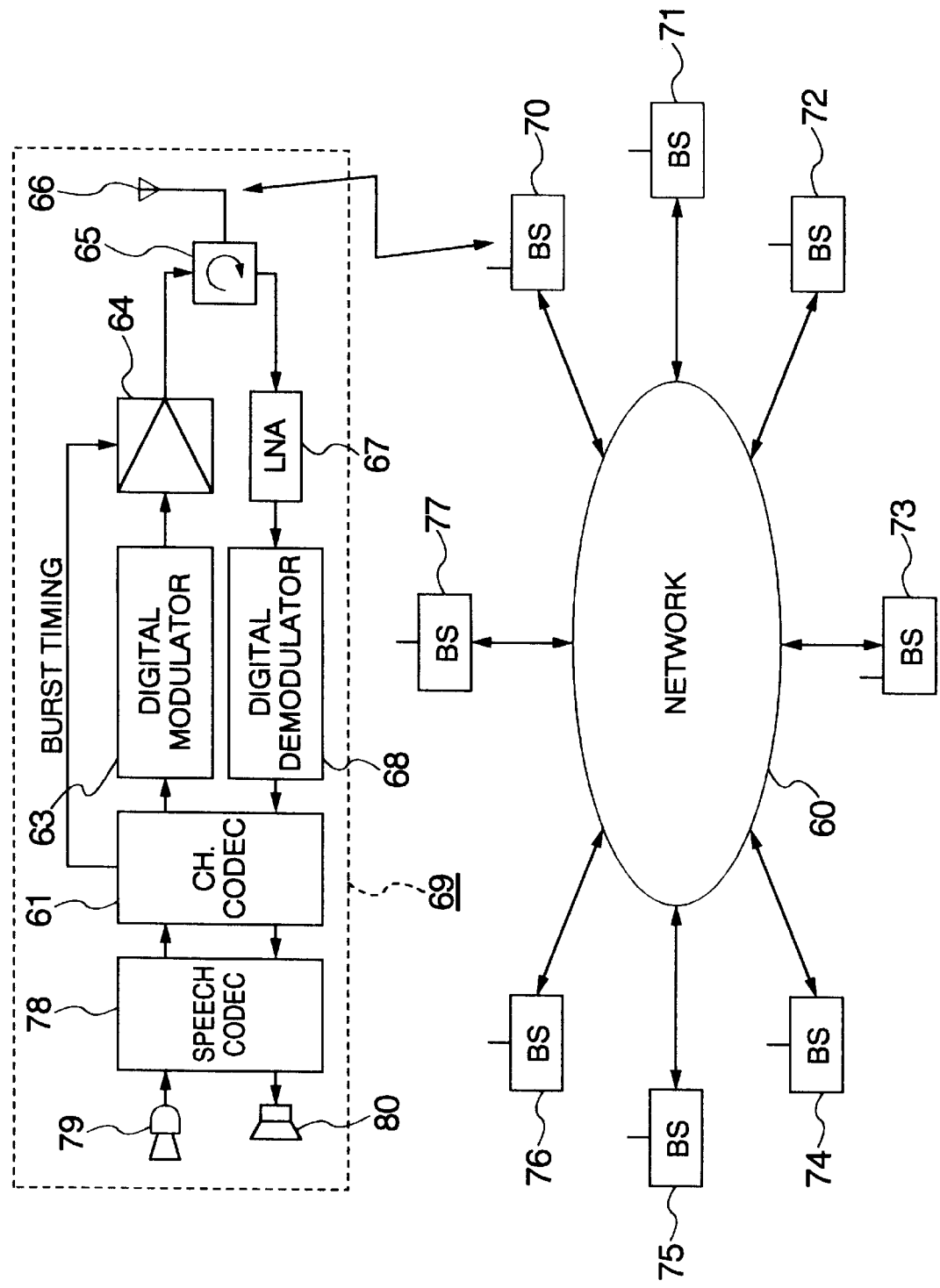
FIG. 10 is a block diagram showing the construction of another embodiment of a TDMA radio communication system in which the output-controlled power amplifier of the present invention is used.

FIG. 10 is a block diagram showing the construction of another embodiment of a TDMA radio communication system in which the output-controlled power amplifier of the present invention is used. Radio base stations 70, 71, 72, 73, 74, 75, 76 and 77 are connected to a network 60. The base stations form a communication area in which a radio terminal 69 using the output-controlled power amplifier of the present invention makes communication.

The operation of the TDMA radio communication system of FIG. 10 using the output-controlled power amplifier of the present invention will be explained in conjunction with the case where the radio terminal 69 makes communication through the radio base station 70. Information transmitted from the network 60 enters the radio base station 70. The information is converted in the radio base station 70 into a burst modulated signal and is thereafter transmitted therefrom to the radio terminal 69. In the radio terminal 69, the signal is captured by an antenna 66, sent by a circulator 65 to a low-noise amplifier (LNA) 67, subjected to low-noise amplification by the LNA 67, converted by a digital demodulator 68 into burst data, and converted by a channel codec 61 and a speech codec 78 into a speech signal which is in turn outputted as a receive speech by a receiver set 80. On the other hand, a transmit speech is converted by a microphone 79 into a speech signal and then converted by the speech codec 78 and the channel codec 61 into burst data. Thereafter, the burst data is converted by the digital modulator 63 into a burst modulated signal, power-amplified by an output-controlled power amplifier 64 of the present invention, sent by the circulator 65 to the antenna 66, and then transmitted through the antenna 66 to the radio base station 70 for the transfer of the information to the network 60. The channel codec 61 sends a burst timing signal to the burst monitor circuit 9 of the output-controlled power amplifier 64 to control the output-controlled power amplifier 64.

Like the embodiment shown in FIG. 9, the present embodiment shown in FIG. 10 copes with a change in output power (such as the change of the burst modulated signal power of the digital modulator 63 or the change in gain of the power amplifier 2 caused from a temperature change or a frequency change) by controlling the amount of attenuation by the variable attenuator 1 of the output-controlled power amplifier 64 so that the change in output power is cancelled to hold the output power of the radio terminal 69 always constant. Thereby, the communication area can be established stably and the variations of interference to the neighboring radio base stations 71, 72, 73, 74, 75, 76 and 77 are reduced. As a result, the communication quality of the system is improved.

According to the present invention, the output voltage of the hold circuit can be converged at a high speed by approximating the waveform of a signal transferred in the closed loop to a Gaussian waveform. Thereby, it is possible to shorten a burst signal rise time of a communication equipment which transmits a burst signal.

After the output of the output-controlled power amplifier has been converged to a predetermined constant value, the output of the hold circuit is forcibly held at a constant value and the attenuation of the variable attenuator is also held constant. Namely, the closed loop is annulled. Therefore, even if a signal transferred in the power amplifier through the variable attenuator includes a change in amplitude caused by modulation, no feedback action of suppressing this change is generated. Accordingly, there is no possibility that a new varying component other than the change caused from the modulation is superimposed on the carrier. As a result, it is possible to realize an output-controlled power amplifier having an improved signal-to-noise ratio.

Further, with use of the output-controlled power amplifier of the present invention as a power amplifier of a radio communication terminal or a radio communication base station, it is possible to provide a radio communication terminal or base station which has a high speed and an improved signal-to-noise ratio.

What is claimed is:

1. An output-controlled power amplifier comprising:

a variable attenuator inputted with an input signal for attenuating the power of said input signal to output the attenuated signal;

a power amplifier connected to said variable attenuator for amplifying an output signal of said variable attenuator to output the amplified signal;

a power divider connected to said power amplifier for dividing an output signal of said power amplifier into a plurality of outputs to provide the plurality of outputs;

an envelope detector connected to said power divider for envelope-detecting an output signal provided by said power divider to output the envelope-detected signal;

a temperature compensation circuit connected to said envelope detector for holding the conversion gain of said envelope detector for temperature change constant;

a filter connected to said temperature compensation circuit for waveform-shaping an output signal of said temperature compensation circuit to output the waveform-shaped signal;

a reference voltage generation circuit connected to said temperature compensation circuit for generating a reference voltage and supplying said reference voltage to said temperature compensation circuit;

a hold circuit connected to said filter for extracting and holding an output signal of said filter; and a burst monitor circuit connected to said hold circuit for controlling said hold circuit on the basis of a burst timing signal inputted from the exterior; wherein said hold circuit is connected to said variable attenuator so that said variable attenuator attenuates the power of said input signal on the basis of an output signal of said hold circuit.

2. An output-controlled power amplifier according to claim 1, wherein a burst signal is inputted as said input signal; and wherein said hold circuit includes a circuit for bringing the output of said hold circuit to a predetermined voltage level in a halt period after said burst signal is outputted to the exterior.

3. An output-controlled power amplifier according to claim 1, further comprising a circuit for allowing said hold circuit to make the extraction on the basis of a predetermined time.

4. An output-controlled power amplifier according to claim 1, wherein a closed-loop transfer function of the output-controlled power amplifier has a Gaussian characteristic substantially.

5. An output-controlled power amplifier according to claim 1, wherein the pole of a closed-loop transfer function of the output-controlled power amplifier is a Gaussian characteristic function substantially.

6. A radio communication terminal comprising an output-controlled power amplifier according to claim 1.

7. A radio communication base station comprising an output-controlled power amplifier according to claim 1.

8. An output-controlled power amplifier according to claim 1, wherein said filter includes an active filter.

9. An output-controlled power amplifier according to claim 8, wherein said active filter has the order of filter which is the third order at the highest.

10. An output-controlled power amplifier according to claim 1, wherein a connection circuit of said temperature compensation circuit and said filter is formed by an active filter.

11. An output-controlled power amplifier according to claim 10, wherein said active filter has the order of filter which is the third order at the highest.

12. An output-controlled power amplifier comprising:

a variable attenuator inputted with an input signal for attenuating the power of said input signal to output the attenuated signal;

a power amplifier connected to said variable attenuator for amplifying an output signal of said variable attenuator to output the amplified signal;

a power divider connected to said power amplifier for dividing an output signal of said power amplifier into a plurality of outputs to provide the plurality of outputs;

an envelope detector connected to said power divider for envelope-detecting an output signal provided by said power divider to output the envelope-detected signal;

a temperature compensation circuit connected to said envelope detector for holding the conversion gain of said envelope detector for temperature change constant;

a reference voltage generation circuit connected to said temperature compensation circuit for generating a reference voltage and supplying said reference voltage to said temperature compensation circuit;

a hold circuit connected to said temperature compensation circuit for extracting and holding an output signal of said temperature compensation circuit;

a filter connected to said hold circuit for waveform-shaping an output signal of said hold circuit to output the waveform-shaped signal; and a burst monitor circuit connected to said hold circuit for controlling said hold circuit on the basis of a burst timing signal inputted from the exterior;

wherein said filter is connected to said variable attenuator so that said variable attenuator attenuates the power of said input signal on the basis of an output signal of said filter.

13. An output-controlled power amplifier according to claim 12, wherein a burst signal is inputted as said input signal; and wherein said hold circuit includes a circuit for bringing the output of said hold circuit to a predetermined voltage level in a halt period after said burst signal is outputted to the exterior.

14. An output-controlled power amplifier according to claim 12, further comprising a circuit for allowing said hold circuit to make the extraction on the basis of a predetermined time.

15. An output-controlled power amplifier according to claim 12, wherein said filter includes an active filter.

16. An output-controlled power amplifier according to claim 15, wherein said active filter has the order of filter which is the third order at the highest.

17. An output-controlled power amplifier according to claim 12, wherein a closed-loop transfer function of the output-controlled power amplifier has a Gaussian characteristic substantially.

18. An output-controlled power amplifier according to claim 12, wherein the pole of a closed-loop transfer function of the output-controlled power amplifier is a Gaussian characteristic function substantially.

19. A radio communication terminal comprising an output-controlled power amplifier according to claim 12.

20. A radio communication base station comprising an output-controlled power amplifier according to claim 12.

21. An output-controlled power amplifier comprising:

a variable attenuator inputted with an input signal for attenuating the power of said input signal to output the attenuated signal;

a power amplifier connected to said variable attenuator for amplifying an output signal of said variable attenuator to output the amplified signal;

a power divider connected to said power amplifier for dividing an output signal of said power amplifier into a plurality of outputs to provide the plurality of outputs;

an envelope detector connected to said power divider for envelope-detecting an output signal provided by said power divider to output the envelope-detected signal;

a temperature compensation circuit connected to said envelope detector for holding the conversion gain of said envelope detector for temperature change constant;

a first filter connected to said temperature compensation circuit for waveform-shaping an output signal of said temperature compensation circuit to output the waveform-shaped signal;

a reference voltage generation circuit connected to said temperature compensation circuit for generating a reference voltage and supplying said reference voltage to said temperature compensation circuit;

a hold circuit connected to said first filter for extracting and holding an output signal of said first filter;

a second filter connected to said hold circuit for waveform-shaping an output signal of said hold circuit to output the waveform-shaped signal; and a burst monitor circuit connected to said hold circuit for controlling said hold circuit on the basis of a burst timing signal inputted from the exterior;

wherein said second filter is connected to said variable attenuator so that said variable attenuator attenuates the power of said input signal on the basis of an output signal of said second filter.

22. An output-controlled power amplifier according to claim 21, wherein at least one of said first and second filters includes an active filter.

23. An output-controlled power amplifier according to claim 22, wherein said active filter has the order of filter which is the third order at the highest.

24. An output-controlled power amplifier according to claim 21, wherein a connection circuit of said temperature compensation circuit and said first filter is formed by an active filter.

25. An output-controlled power amplifier according to claim 24, wherein said active filter has the order of filter which is the third order at the highest.

26. An output-controlled power amplifier in which an input signal is inputted, the power of said input signal is attenuated, amplified, and divided into a plurality of divisional signals, and at least one of said divisional signals is outputted to the exterior while another one of said divisional signals is subjected to envelope detection to control said input signal, wherein a closed-loop transfer function of the output-controlled power amplifier is a Gaussian characteristic function substantially.

27. An output-controlled power amplifier according to claim 26, wherein the closed-loop transfer function of the output-controlled power amplifier is a transfer function of a closed-loop circuit in which the power of the input signal is attenuated, amplified, and divided into the plurality of divisional signals, and the other one of the divisional signals is subjected to envelope detection to control the input signal.

28. An output-controlled power amplifier in which an input signal is inputted, the power of said input signal is attenuated, amplified, and divided into a plurality of divisional signals, and at least one of said divisional signals is outputted to the exterior while another one of said divisional signals is subjected to envelope detection to control said input signal, wherein the pole of a closed-loop transfer function of the output-controlled power amplifier is a Gaussian characteristic function substantially.

29. An output-controlled power amplifier according to claim 28, wherein the closed-loop transfer function of the output-controlled power amplifier is a transfer function of a closed-loop circuit in which the power of the input signal is attenuated, amplified, and divided into the plurality of divisional signals, and the other one of the divisional signals is subjected to envelope detection to control the input signal.

30. An output-controlled power amplifier device in which a modulated input signal is inputted in the form of a burst signal to a main path and said input signal is power-attenuated, power-amplified, and thereafter outputted from said main path, comprising:

an RF power amplifier;

a power divider for distributing the amplified input signal between said main path and a feedback path diverging from said main path and outputting the distributed signal from said main path to the exterior; and a control signal generation circuit for generating a control signal for controlling said input signal to said RF power amplifier on the basis of the signal distributed to said feedback path, said control signal generation circuit including a hold circuit provided in said feedback path for extracting the signal distributed to said feedback path and outputting as said control signal a signal having a waveform which holds the value of the power of the extracted signal when the power reaches a predetermined value, said hold circuit being controlled at a burst timing;

wherein said control signal generation circuit includes a reset circuit for setting the output of said hold circuit to a predetermined value corresponding to a voltage level in a halt period of said input burst signal on the basis of said burst timing.

31. An output-controlled power amplifier device according to claim 30, wherein said control signal generation circuit includes a burst monitor circuit for receiving a signal indicative of said burst timing from the exterior to control said hold circuit and said reset circuit.

32. An output-controlled power amplifier device according to claim 31, wherein said control signal generation circuit further includes a temperature compensation circuit connected to said power divider, an output of said temperature compensation circuit being supplied to said hold circuit through said reset circuit.

33. An output-controlled power amplifier device according to claim 32, further comprising a filter connected to said temperature compensation circuit for waveform-shaping an output signal of said temperature compensation circuit.

34. An output-controlled power amplifier device according to claim 30, wherein said RF power amplifier includes a variable attenuator in its front stage and the output of said hold circuit is supplied as a control signal of said variable attenuator.

35. A signal processing system comprising:

a main path including a signal processing circuit inputted with a modulated input signal in the form of a burst signal for processing said modulated input signal to satisfy a predetermined output condition and outputting the processed signal; and a feedback path including a control signal generation circuit for extracting a part of the output of said main path and generating a control signal on the basis of the extracted signal, said control signal being supplied to the input side of said signal processing circuit to control the output of said signal processing circuit for said input burst signal, a hold circuit for receiving the signal extracted to said feedback path on the basis of a timing signal of said input burst signal and generating as said control signal a signal having a waveform which holds the value of the received signal when the signal value reaches a predetermined value, and a reset circuit responsive to said burst timing signal for bringing said hold circuit into a reset condition after said input burst signal is outputted from said main path to the exterior.

36. A signal processing system according to claim 35, wherein said feedback path further includes a waveform shaping filter; and wherein the pole of a closed-loop transfer function of the signal processing system is a Gaussian characteristic function substantially.

37. A signal processing system according to claim 35, wherein a signal level of said hold circuit in the reset condition is set to an initial value adapted for improvement of the speed of the next activation.

38. An output-controlled power amplifier comprising:

a first circuit which attenuates, amplifies, and divides an input signal to produce a plurality of divisional signals, at least one of the divisional signals being output from the output-controlled power amplifier as an output signal, and another one of the divisional signals being a feedback signal; and a second circuit which subjects the feedback signal to envelope detection to produce a control signal for controlling the input signal;

wherein the output-controlled power amplifier has a closed-loop transfer function which is substantially a Gaussian function.

39. An output-controlled power amplifier according to claim 38, wherein the closed-loop transfer function of the output-controlled power amplifier is a transfer function of a closed-loop circuit formed by the first circuit and the second circuit.

40. An output-controlled power amplifier comprising:

a first circuit which attenuates, amplifies, and divides an input signal to produce a plurality of divisional signals, at least one of the divisional signals being output from the output-controlled power amplifier as an output signal, and another one of the divisional signals being a feedback signal; and a second circuit which subjects the feedback signal to envelope detection to produce a control signal for controlling the input signal;

wherein the output-controlled power amplifier has a closed-loop transfer function having a pole of substantially a Gaussian function.

41. An output-controlled power amplifier according to claim 40, wherein the closed-loop transfer function of the output-controlled power amplifier is a transfer function of a closed-loop circuit formed by the first circuit and the second circuit.

42. An output-controlled power amplifier comprising:

a first circuit which attenuates, amplifies, and divides an input signal to produce a plurality of divisional signals, at least one of the divisional signals being output from the output-controlled power amplifier as an output signal, and another one of the divisional signals being a feedback signal; and a second circuit which subjects the feedback signal to envelope detection and filtering to produce a control signal for controlling the input signal;

wherein the filter is configured to make a closed-loop transfer function of the output-controlled power amplifier be substantially a Gaussian function.

43. An output-controlled power amplifier according to claim 42, wherein the control signal controls the first circuit to control the input signal; and wherein the closed-loop transfer function of the output-controlled power amplifier is a transfer function of a closed-loop circuit formed by the first circuit and the second circuit.

44. An output-controlled power amplifier according to claim 42, wherein the first circuit includes an attenuator which attenuates the input signal to produce an attenuated signal, an amplifier which amplifies the attenuated signal to produce an amplified signal, and a divider which divides the amplified signal to produce the plurality of divisional signals; and wherein the second circuit includes an envelope detector which detects an envelope of the feedback signal to produce an envelope signal, and a filter which filters the envelope signal to produce the control signal.

45. An output-controlled power amplifier according to claim 44, wherein the control signal controls the attenuator to control the input signal; and wherein the closed-loop transfer function of the output-controlled power amplifier is a transfer function of a closed-loop circuit formed by the attenuator, the amplifier, the divider, the envelope detector, and the filter.

46. An output-controlled power amplifier comprising:

a first circuit which attenuates, amplifies, and divides an input signal to produce a plurality of divisional signals, at least one of the divisional signals being output from the output-controlled power amplifier as an output signal, and another one of the divisional signals being a feedback signal; and a second circuit which subjects the feedback signal to envelope detection and filtering to produce a control signal for controlling the input signal;

wherein the filter is configured to make a closed-loop transfer function of the output-controlled power amplifier have a pole of substantially a Gaussian function.

47. An output-controlled power amplifier according to claim 46, wherein the control signal controls the first circuit to control the input signal; and wherein the closed-loop transfer function of the output-controlled power amplifier is a transfer function of a closed-loop circuit formed by the first circuit and the second circuit.

48. An output-controlled power amplifier according to claim 46, wherein the first circuit includes an attenuator which attenuates the input signal to produce an attenuated signal, an amplifier which amplifies the attenuated signal to produce an amplified signal, and a divider which divides the amplified signal to produce the plurality of divisional signals; and wherein the second circuit includes an envelope detector which detects an envelope of the feedback signal to produce an envelope signal, and a filter which filters the envelope signal to produce the control signal.

49. An output-controlled power amplifier according to claim 48, wherein the control signal controls the attenuator to control the input signal; and wherein the closed-loop transfer function of the output-controlled power amplifier is a transfer function of a closed-loop circuit formed by the attenuator, the amplifier, the divider, the envelope detector, and the filter.

* * * * *